US009380688B1

(12) United States Patent
Feng et al.

(10) Patent No.: US 9,380,688 B1
(45) Date of Patent: Jun. 28, 2016

(54) AIR GAP ELECTROSTATIC DISCHARGE STRUCTURE FOR HIGH SPEED CIRCUITS

(71) Applicants: International Business Machines Corporation, Armonk, NY (US); GlobalFoundries, Inc., Grand Cayman (KY)

(72) Inventors: Kai D. Feng, Hopewell Junction, NY (US); Yang Liu, Ossining, NY (US); Dongbing Shao, Wappingers Falls, NY (US); Zheng Xu, Wappingers Falls, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/985,542

(22) Filed: Dec. 31, 2015

(51) Int. Cl.
| | |
|---|---|
| *H02H 9/06* | (2006.01) |
| *H05F 3/04* | (2006.01) |
| *H02H 7/20* | (2006.01) |

(52) U.S. Cl.
CPC . *H05F 3/04* (2013.01); *H02H 7/205* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 4,809,044 | A * | 2/1989 | Pryor .................. | H01L 27/2463 257/3 |
| 5,216,631 | A * | 6/1993 | Sliwa, Jr. ................ | G11B 5/35 365/118 |
| 7,768,762 | B2 | 8/2010 | Ding | |
| 7,915,158 | B2 | 3/2011 | Ding | |
| 8,279,572 | B2 | 10/2012 | Ding | |
| 8,779,466 | B2 * | 7/2014 | Adachi ..................... | H01T 4/12 257/173 |
| 9,070,586 | B1 | 6/2015 | Dang | |
| 2004/0134683 | A1 * | 7/2004 | Festag ...................... | H01P 1/30 174/261 |
| 2006/0061925 | A1 * | 3/2006 | Shrier ...................... | H01C 7/10 361/56 |
| 2008/0239610 | A1 * | 10/2008 | Yu ............................. | H01T 4/10 361/120 |
| 2009/0316314 | A1 * | 12/2009 | Ding ....................... | H01L 23/60 361/56 |
| 2011/0211289 | A1 * | 9/2011 | Kosowsky .......... | H01L 27/0288 361/91.1 |
| 2012/0300355 | A1 * | 11/2012 | Umeda ................. | H05K 9/0067 361/220 |
| 2015/0001671 | A1 * | 1/2015 | In 'T Zandt ............. | H01L 21/74 257/506 |
| 2015/0002966 | A1 * | 1/2015 | In 'T Zandt ............. | H01J 9/025 361/56 |
| 2015/0138827 | A1 * | 5/2015 | Song ..................... | H01L 25/167 362/606 |
| 2016/0009547 | A1 * | 1/2016 | Mason ..................... | B81B 7/02 257/415 |

FOREIGN PATENT DOCUMENTS

IT    WO 2013109196 A3 * 11/2013  ........... H05K 9/0067

* cited by examiner

*Primary Examiner* — Ronald W Leja
(74) *Attorney, Agent, or Firm* — Cantor Colburn LLP; Louis Percello

(57) ABSTRACT

Aspects relate to an electrostatic discharge (ESD) system for ESD protection and a method of manufacturing. The ESD system includes a lower substrate, an underfill layer that is disposed on the lower substrate that includes a plurality of cavities, and an upper substrate disposed on the underfill layer. The upper substrate includes a plurality of air ventilation shafts. The ESD system also includes a plurality of air gap metal tip structures disposed within one or more of the plurality of cavities in the underfill, wherein the plurality of ventilation shafts line up with the plurality of air gap metal tip structures. At least one air gap tip structure includes an upper metallic tip and a lower metallic tip that are placed along a vertical axis that is perpendicular to the substrates. An air cavity is provided between the upper metallic tip and the lower metallic tip forming an air chamber.

20 Claims, 10 Drawing Sheets

AIR GAP ELECTROSTATIC DISCHARGE STRUCTURE FOR HIGH SPEED CIRCUITS

BACKGROUND

The present disclosure relates generally to an electrostatic discharge (ESD) structure and, more specifically, to an air gap ESD structure for high speed circuits.

Many integrated circuits included in devices and systems are highly susceptible to damage from the discharge of static electricity, which has become a critical problem for the electronics industry. Accordingly, electrostatic discharge (ESD) protection is a feature included as a standard for many electronic products. Typical ESD protection circuits use an on-chip diode based ESD protection. These on-chip diode ESD devices work well for lower frequency currents but at higher speed circuits such as millimeter wave circuits, these ESD protection circuits severely impair the performance of the millimeter wave circuits because of the ESD protection circuit's inability to ameliorate the large parasitic capacitance that arises during the high operating frequency. Therefore, on chip metal tip ESD protection devices with small parasitic capacitance have been provided for high speed systems to help reduce the performance degradation caused by conventional on chip diode based ESD protection circuits.

However, conventional on chip metal tip ESD protection device can only protect the system one time because the material found between the on chip metal tips, which may be silicon oxide for example, is damaged during a protection event. Particularly, when an arc occurs during an electrostatic discharge between the metal tips, it is possible that the material found between the tips is compromised or damaged and cannot be recovered. Further, device failures that result from ESD events are not always immediately catastrophic or apparent. Sometimes, the device is only slightly weakened but is less able to withstand normal operating stresses and hence, may result in a reliability problem.

In many systems, an ESD protection device is desired to not only to pass an ESD protection test, but also to protect the system from the instant high voltage generated by a hot plug which would can occur any time. Therefore, in accordance with one approach, various single use electro-static discharge (ESD) protection circuits can be included in a device and/or system to protect the components.

Thus, there is a need for an ESD protection device that can function more than once and ideally function unlimited times to help protect the system from an electrostatic discharge.

SUMMARY

According to embodiments, a method, system, and computer program product are provided for an electrostatic discharge (ESD) structure and, more specifically, an air gap ESD structure for high speed circuits.

In accordance with an embodiment, an air gap metal tip structure for electrostatic discharge (ESD) protection is provided. The air gap metal tip structure for electrostatic discharge (ESD) protection includes an upper metallic tip and a lower metallic tip. The upper metallic tip includes a first contact surface that is attached to an inner ceiling surface of an upper substrate, a first body that extends downward from the inner ceiling surface, and a first point, wherein the first body is tapered to form the first point opposite the first contact surface away from the inner ceiling surface. The lower metallic tip includes a second contact surface that is attached to an inner floor surface of a lower substrate, a second body that extends upward from the inner floor surface, and a second point, wherein the second body is tapered to form the second point opposite the second contact surface away from the inner floor surface. The first point of the upper metallic tip and the second point of the lower metallic tip are disposed along a vertical axis that is perpendicular to the upper substrate and the lower substrate, and wherein an air cavity is provided between the first point and the second point. The air gap metal tip structure for electrostatic discharge (ESD) protection also includes an air chamber formed between the upper substrate and the lower substrate within which the upper metallic tip and the lower metallic tip are disposed.

In accordance with another embodiment, an electrostatic discharge (ESD) system for ESD protection is provided. The ESD system includes a lower substrate that includes one or more layers of logic circuitry, an underfill layer that is disposed on the lower substrate, wherein the underfill layer includes a plurality of cavities, an upper substrate disposed on the underfill layer, wherein the upper substrate includes a plurality of air ventilation shafts, and a plurality of air gap metal tip structures disposed within one or more of the plurality of cavities in the underfill layer, wherein the plurality of ventilation shafts line up with the plurality of air gap metal tip structures. At least one air gap tip structure includes an upper metallic tip including a first contact surface that is attached to an inner ceiling surface of the upper substrate, a first body that extends downward from the inner ceiling surface, and a first point, wherein the first body is tapered to form the first point opposite the first contact surface away from the inner ceiling surface, a lower metallic tip including a second contact surface that is attached to an inner floor surface of the lower substrate, a second body that extends upward from the inner floor surface, and a second point, wherein the second body is tapered to form the second point opposite the second contact surface away from the inner floor surface. The first point of the upper metallic tip and the second point of the lower metallic tip are disposed along a vertical axis that is perpendicular to the upper substrate and the lower substrate, and wherein an air cavity is provided between the first point and the second point. The ESD system also includes an air chamber formed between the upper substrate and the lower substrate within which the upper metallic tip and the lower metallic tip are disposed.

In accordance with another embodiment, a method of manufacturing an electrostatic discharge (ESD) system for ESD protection, the method including receiving a lower substrate and an upper substrate, etching and patterning a plurality of air ventilation shafts in the upper substrate, transferring a plurality of metallic material elements on the lower substrate and the upper substrate, transferring an upper metallic tip on one of the plurality of metallic material elements on the upper substrate, wherein the upper metallic tip is adjacent to the air ventilation shafts, transferring a lower metallic tip on one of the plurality of metallic material elements on the lower substrate, bonding the lower substrate and the upper substrate together by bonding the plurality of metallic material elements on the upper substrate to the plurality of metallic material elements on the lower substrate, wherein the upper metallic tip is directly above the lower metallic tip, and injecting an underfill layer between the upper substrate and the lower substrate, wherein a chamber around the upper metallic tip and lower metallic tip is left vacant forming an air gap that surrounds the upper metallic tip and the lower metallic tip that is connected to the air ventilation shafts.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The forgoing and other features, and advantages of the invention are apparent from the following detailed description taken in conjunction with the accompanying drawings in which.

DETAILED DESCRIPTION

It is understood in advance that although this disclosure includes a detailed description on a single computer system with a plurality of sub-components, implementation of the teachings recited herein are not limited to a computer system and environment. Rather, embodiments of the present invention are capable of being implemented in conjunction with any other type of electronic and/or computing environment now known or later developed such as systems that include multiple computers or clusters of systems or one or more sub-components or sub-component elements that include an integrated circuit and/or substrate that may be subject to electrostatic discharge.

Embodiments described herein are directed to an air gap metal tip structure for electrostatic discharge (ESD) protection. An ESD can be defined as a transfer of an electro-static charge between bodies at different electro-static potentials (voltages), caused by direct contact or induced by an electro-static field.

For example, a number of embodiments are described herewith that provide an air gap metal tip structure within an electronic device or system. The air gap metal tip structure is configured such that it can handle and guide an arc caused by and ESD event from an upper tip to a lower tip through an air chamber that houses both tips. The air that the arc travels through is partially made up of oxygen (3 $O_2$) which becomes ozone (2 $O_3$) when the arc passes through. The ozone will then decompose back to oxygen automatically thereby placing the air gap metal tip structure back in its original state ready to once again provide ESD protection. Ventilation holes may also be provided to allow any expanded air to escape the air chamber and then return once the ESD system stabilizes once again. Accordingly, one or more embodiments provide an on-chip metal tip ESD protection structure that includes an air gap and a method of manufacturing the structure. For example, an air gap metal tip structure can be used for millimeter wave circuits for ESD protection.

Figure 1:
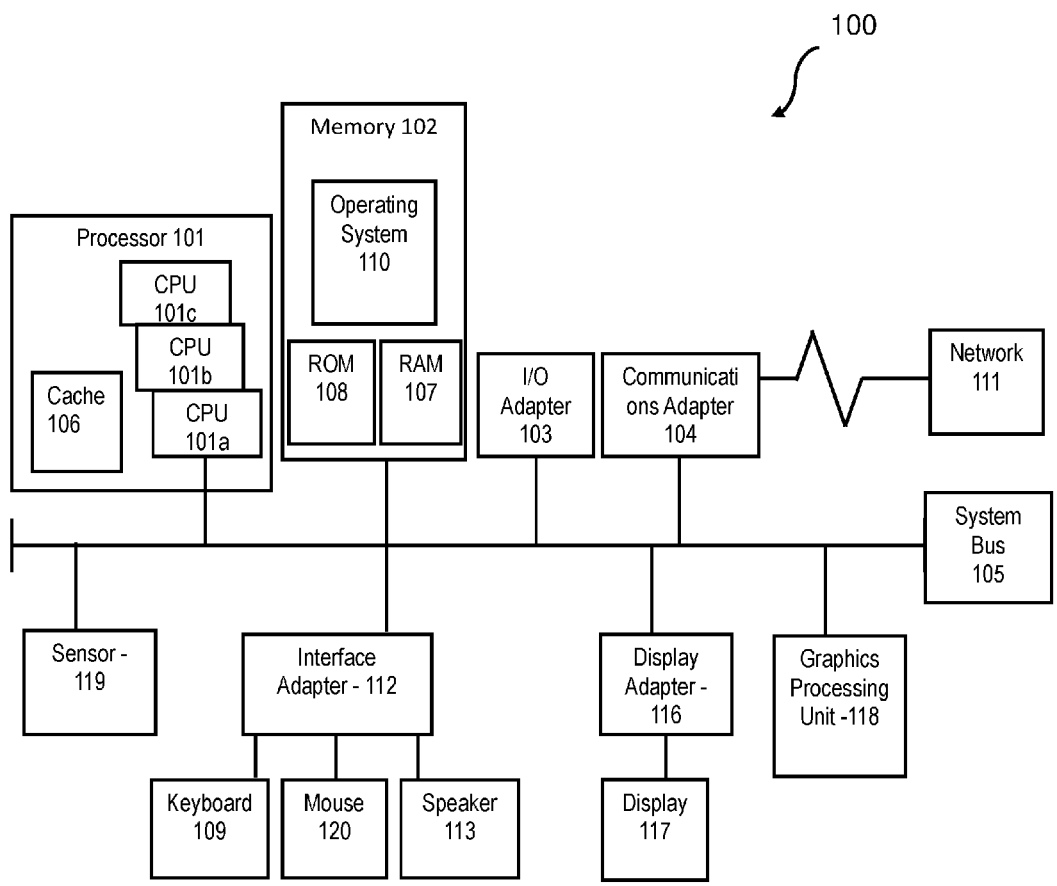
FIG. 1 depicts a block diagram of a computer system for implementing some or all aspects of the system, in accordance with some embodiments of this disclosure.

Turning now to FIG. 1, an electronic computing device 100, which may also be called a computer system 100, that includes a plurality of electronic computing device sub-components is generally shown in accordance with one or more embodiments. Additionally, one or more integrated circuits in need of ESD protection can be included in one or more of the plurality of electronic computing device sub-components. Particularly, FIG. 1 illustrates a block diagram of a computer system 100 (hereafter "computer 100") for use in practicing the embodiments described herein. The methods described herein can be implemented in hardware, software (e.g., firmware), or a combination thereof. In an exemplary embodiment, the methods described herein are implemented in hardware, and may be part of the microprocessor of a special or general-purpose digital computer, such as a personal computer, workstation, minicomputer, or mainframe computer. Computer 100 therefore can embody a general-purpose computer. In another exemplary embodiment, the methods described herein are implemented as part of a mobile device, such as, for example, a mobile phone, a personal data assistant (PDA), a tablet computer, etc.

In an exemplary embodiment, in terms of hardware architecture, as shown in FIG. 1, the computer 100 includes processor 101. Computer 100 also includes memory 102 coupled to processor 101, and one or more input and/or output (I/O) adaptors 103, that may be communicatively coupled via a local system bus 105. Communications adaptor 104 may be operatively connect computer 100 to one or more networks 111. System bus 105 may also connect one or more user interfaces via interface adaptor 112. Interface adaptor 112 may connect a plurality of user interfaces to computer 100 including, for example, keyboard 109, mouse 120, speaker 113, etc. System bus 105 may also connect display adaptor 116 and display 117 to processor 101. Processor 101 may also be operatively connected to graphical processing unit 118.

Further, the computer 100 may also include a sensor 119 that is operatively connected to one or more of the other electronic sub-components of the computer 100 through the system bus 105. The sensor 119 can be an integrated or a standalone sensor that is separate from the computer 100 and may be communicatively connected using a wire or may communicate with the computer 100 using wireless transmissions.

Processor 101 is a hardware device for executing hardware instructions or software, particularly that stored in a non-transitory computer-readable memory (e.g., memory 102). Processor 101 can be any custom made or commercially available processor, a central processing unit (CPU), a plurality of CPUs, for example, CPU 101a-101c, an auxiliary processor among several other processors associated with the computer 100, a semiconductor based microprocessor (in the form of a microchip or chip set), a macroprocessor, or generally any device for executing instructions. Processor 101 can include a memory cache 106, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 106 may be organized as a hierarchy of more cache levels (L1, L2, etc.).

Memory 102 can include random access memory (RAM) 107 and read only memory (ROM) 108. RAM 107 can be any one or combination of volatile memory elements (e.g., DRAM, SRAM, SDRAM, etc.). ROM 108 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 102 may incorporate electronic, magnetic, optical, and/or other types of non-transitory computer-readable storage media. Note that the memory 102 can have a distributed architecture, where various components are situated remote from one another, but can be accessed by the processor 101.

The instructions in memory 102 may include one or more separate programs, each of which comprises an ordered listing of computer-executable instructions for implementing logical functions. In the example of FIG. 1, the instructions in memory 102 may include a suitable operating system 110. Operating system 110 can control the execution of other computer programs and provides scheduling, input-output control, file and data management, memory management, and communication control and related services.

Input/output adaptor 103 can be, for example but not limited to, one or more buses or other wired or wireless connections, as is known in the art. The input/output adaptor 103 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

Interface adaptor 112 may be configured to operatively connect one or more I/O devices to computer 100. For example, interface adaptor 112 may connect a conventional keyboard 109 and mouse 120. Other output devices, e.g., speaker 113 may be operatively connected to interface adaptor 112. Other output devices may also be included, although not shown. For example, devices may include but are not limited to a printer, a scanner, microphone, and/or the like. Finally, the I/O devices connectable to interface adaptor 112 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

Computer 100 can further include display adaptor 116 coupled to one or more displays 117. In an exemplary embodiment, computer 100 can further include communications adaptor 104 for coupling to a network 111.

Network 111 can be an IP-based network for communication between computer 100 and any external device. Network 111 transmits and receives data between computer 100 and external systems. In an exemplary embodiment, network 111 can be a managed IP network administered by a service provider. Network 111 may be implemented in a wireless fashion, e.g., using wireless protocols and technologies, such as WiFi, WiMax, etc. Network 111 can also be a packet-switched network such as a local area network, wide area network, metropolitan area network, Internet network, or other similar type of network environment. The network 111 may be a fixed wireless network, a wireless local area network (LAN), a wireless wide area network (WAN) a personal area network (PAN), a virtual private network (VPN), intranet or other suitable network system.

If computer 100 is a PC, workstation, laptop, tablet computer and/or the like, the instructions in the memory 102 may further include a basic input output system (BIOS) (omitted for simplicity). The BIOS is a set of essential routines that initialize and test hardware at startup, start operating system 110, and support the transfer of data among the operatively connected hardware devices. The BIOS is stored in ROM 108 so that the BIOS can be executed when computer 100 is activated. When computer 100 is in operation, processor 101 may be configured to execute instructions stored within the memory 102, to communicate data to and from the memory 102, and to generally control operations of the computer 100 pursuant to the instructions.

According to one or more embodiments, any one of the electronic computing device sub-components of the computer 100 includes a circuit board connecting circuit elements that may be configured to provide specific functionality like processing data or providing power. Any of these elements may be at risk of experiencing an electrostatic discharge that could damage or destroy an integrated circuit or any element across which the discharge travels across.

Accordingly, an air gap metal tip structure may be integrated on the circuit boards between the circuit elements, or within the circuit elements, or in combination with any of the electronic computing device sub-components to form one or more discharge paths available in the system for handling an electrostatic discharge event. For example, the display 117 or the sensor 119 can include an air gap metal tip structure that can be integrally formed thereby providing ESD protection for a circuit found within either the display 117 or sensor 119. This air gap metal tip structure allows the protected sub-components of the computer system to withstand multiple ESD events and continue to operate. According to one or more embodiments, the computer system within which an air gap metal tip structure is included to provide ESD protection may be a portable electronic device such as a smartphone or a wearable electronic.

Figure 2:
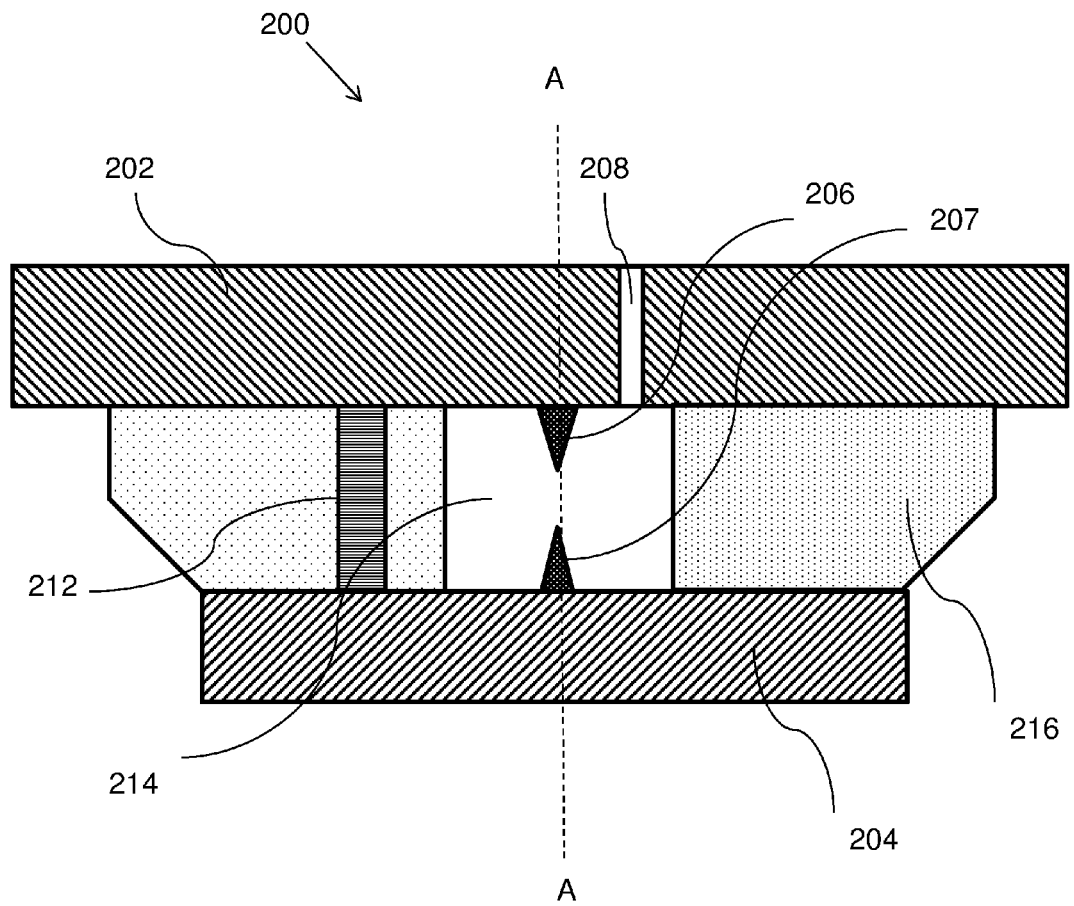
FIG. 2 depicts a side cross-sectional view of an electrostatic discharge (ESD) system that includes an air gap metal tip structure in accordance with some embodiments of this disclosure.

For example, turning now to FIG. 2, a side cross-sectional view of an electrostatic discharge (ESD) system 200 that includes an air gap metal tip structure is shown in accordance with some embodiments of this disclosure. The ESD system 200 includes a lower substrate 204, an upper substrate 202, and an underfill layer 216. The lower substrate 204 can include one or more layers of logic circuitry. The underfill layer 216 is located on the lower substrate 204 and includes at least one cavity that is configured to only contain air. This cavity can be called an air chamber 214. The upper substrate 202 is located on top of the underfill layer 216 and includes at least one air ventilation shaft 208. The air ventilation shaft 208 extends from the air chamber 214 through the upper substrate 202 to an upper surface of the upper substrate 202. The ESD system 200 also includes an air gap metal tip structure that includes the cavity, or also called the air chamber 214, that is connected to the ventilation shaft 208.

The air gap tip structure also includes an upper metallic tip 206 and a lower metallic tip 207. The upper metallic tip 206 includes a first contact surface that is attached to an inner ceiling surface of the upper substrate 202. The upper metallic tip 206 also includes a first body that extends downward from the inner ceiling surface and a first point. The first body is tapered to form the first point opposite the first contact surface away from the inner ceiling surface. The air gap tip structure also includes a lower metallic tip 207 that includes a second contact surface that is attached to an inner floor surface of the lower substrate 204. The lower metallic tip 207 also includes a second body that extends upward from the inner floor surface and a second point. The second body is tapered to form the second point opposite the second contact surface away from the inner floor surface.

Further, the first point of the upper metallic tip 206 and the second point of the lower metallic tip 207 are disposed along a vertical axis A-A which is perpendicular to the upper substrate 202 and the lower substrate 204. An air cavity is provided between the first point and the second point by the air chamber 214 formed between the upper substrate 202 and the lower substrate 204 within which the upper metallic tip 206 and the lower metallic tip 207 are disposed.

The air gap tip structure also includes a conductive connection that extends around the air chamber 214 and connects the upper metallic tip 206 and the lower metallic tip 207 by connecting the first contact surface to the second contact surface. The conductive connection extends from the first contact surface, through the upper substrate 202, down through the underfill layer 216 and through the lower substrate 204 to the second contact surface. According to an embodiment, the conductive connection can be a redistribution layer (RDL). The conductive connection can also include a metallic pillar 212 that extends through the underfill layer 216 providing a conductive path between the upper substrate 202 and the lower substrate 204.

According to one or more embodiments, the upper metallic tip 206 and the lower metallic tip 207 are atomic-level sharp protrusions. According to another embodiment, the upper substrate 202 is an organic substrate and the lower substrate 204 is a silicon substrate. According to another embodiment, the lower substrate 204 includes a silicon substrate and an integrated circuit disposed on the silicon substrate, wherein the integrated circuit has undergone a front end of line (FEOL) stage of IC fabrication. According to another embodiment, the integrated circuit has also undergone a back end of line (BEOL) stage of IC fabrication. According to yet another embodiment, the ESD system may include a plurality of air gap metal tip structures that are either evenly spaced all over the ESD system or are spaced based on ESD system needs.

Figure 3:
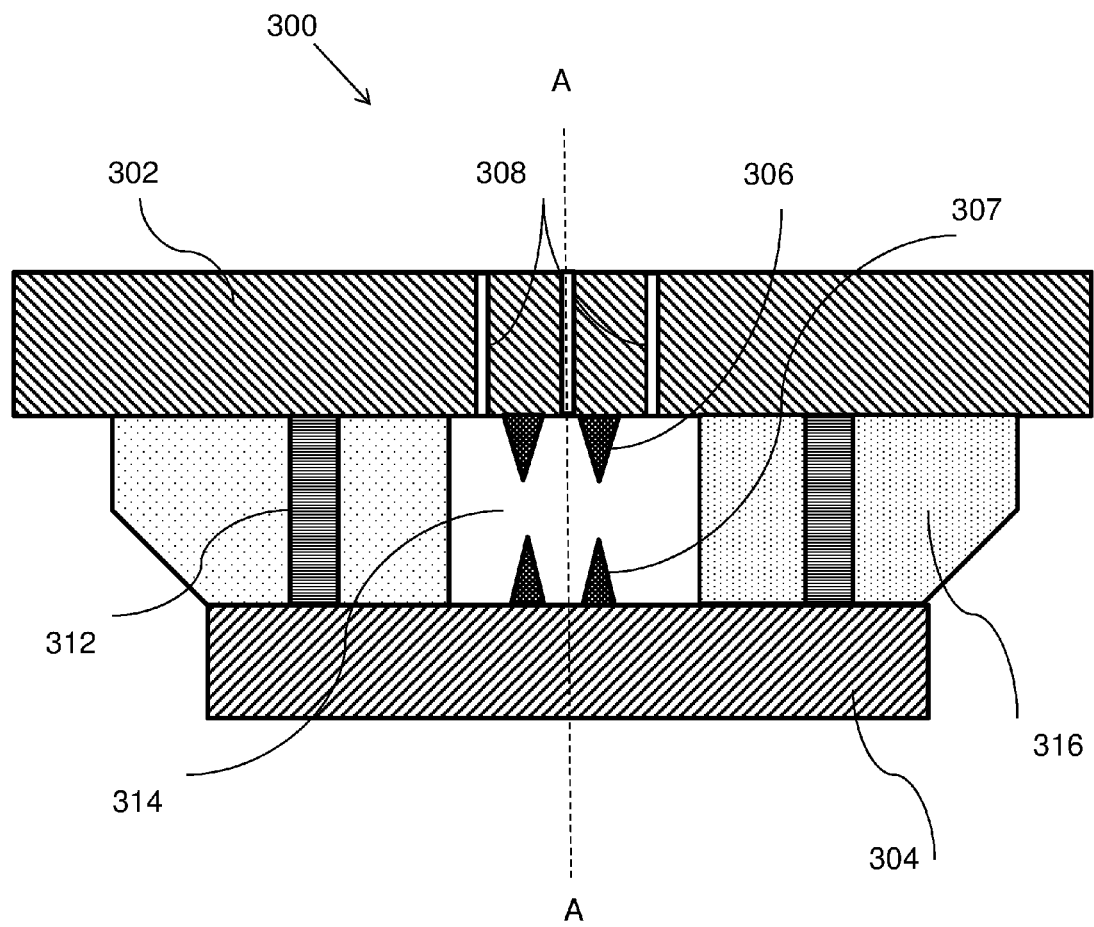
FIG. 3 depicts a side cross-sectional view of an ESD system that includes an air gap metal tip structure in accordance with some embodiments of this disclosure.

FIG. 3 depicts a side cross-sectional view of an ESD system 300 that includes an air gap metal tip structure in accordance with some embodiments of this disclosure. The ESD system 300 includes a lower substrate 304, an upper substrate 302, and an underfill layer 316. The lower substrate 304 can include one or more layers of logic circuitry. The underfill layer 316 is located on the lower substrate 304 and includes at least one cavity that is configured to only contain air. This cavity can be called an air chamber 314. The upper substrate 302 is located on top of the underfill layer 316 and includes a plurality of air ventilation shafts 308. The plurality of air ventilation shafts 308 extend from the air chamber 314 through the upper substrate 302 to an upper surface of the upper substrate 302. Further, as shown in FIG. 3, the ventilation shafts 308 are placed in an alternating pattern between each of the plurality of upper metal tips 306. The ESD system 300 also includes an air gap metal tip structure that includes the cavity, or also called the air chamber 314, that is connected to the plurality of ventilation shafts 308.

The air gap metal tip structure also includes a plurality of upper metallic tips 306 and a plurality of lower metallic tips 307. Specifically, as show the air gap metal tip structure has two upper metallic tips and two lower metallic tips. Each of the plurality of upper metallic tips 306 include a first contact surface that is attached to an inner ceiling surface of the upper substrate 302. Each of the plurality of upper metallic tips 306 also includes a first body that extends downward from the inner ceiling surface and a first point. The first body is tapered to form the first point opposite the first contact surface away from the inner ceiling surface. The air gap tip structure also includes a plurality of lower metallic tips 307. Each of the plurality of lower metallic tips 307 includes a second contact surface that is attached to an inner floor surface of the lower substrate 304. The plurality of lower metallic tips 307 also includes a second body that extends upward from the inner floor surface and a second point. The second body is tapered to form the second point opposite the second contact surface away from the inner floor surface.

Further, the first point of each of the plurality of the upper metallic tips 306 and the second point of each of the plurality of lower metallic tips 307 are disposed in-line with a vertical axis A-A which is perpendicular to the upper substrate 302 and the lower substrate 304. An air cavity is provided between the first point and the second point by the air chamber 314 formed between the upper substrate 302 and the lower substrate 304 within which the plurality of upper metallic tips 306 and the plurality of lower metallic tips 307 are disposed.

The air gap metallic tip structure also includes a conductive connection that extends around the air chamber 314 and connects one of the plurality of upper metallic tips 306 and one of the plurality of lower metallic tips 307 by connecting the first contact surface to the second contact surface. The conductive connection extends from the first contact surface, through the upper substrate 302, down through the underfill layer 316 and through the lower substrate 304 to the second contact surface. According to an embodiment, the conductive connection can be a redistribution layer (RDL). The conductive connection can also include a metallic pillar 312 that extends through the underfill layer 316 providing a conductive path between the upper substrate 302 and the lower substrate 304. A similar conductive connection and metallic pillar 312 connection arrangement can be provided for each of the plurality of upper and lower metallic tips 306,307.

Figure 5:
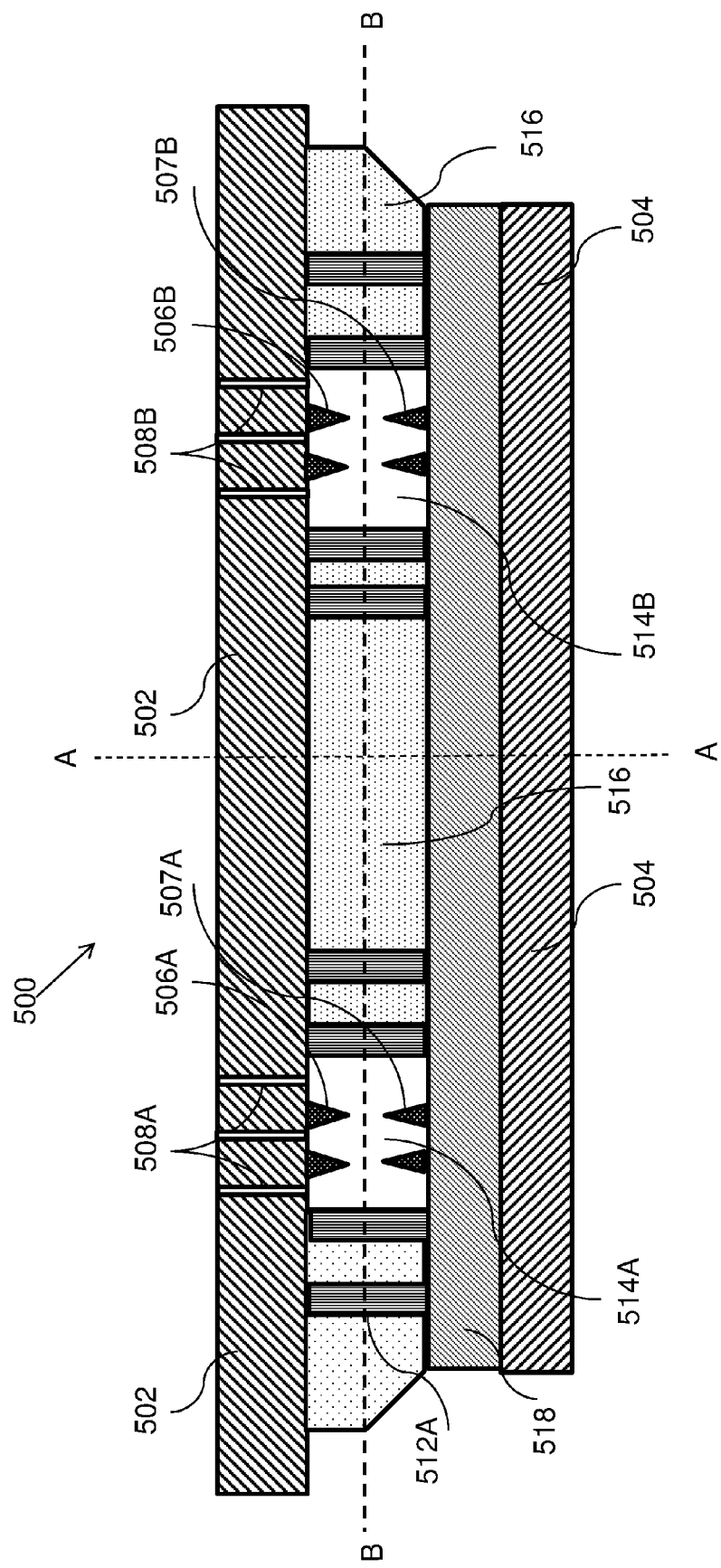
FIG. 5 depicts a side cross-sectional view of an ESD system that includes a plurality of air gap metal tip structures in accordance with some embodiments of this disclosure.

According to one or more embodiments, the plurality of upper metallic tips 306 and the plurality of lower metallic tips 307 are atomic-level sharp protrusions. According to another embodiment, the upper substrate 302 is an organic substrate and the lower substrate 304 is a silicon substrate. According to another embodiment, the lower substrate 304 includes a silicon substrate and an integrated circuit disposed on the silicon substrate, wherein the integrated circuit has undergone a front end of line (FEOL) stage of IC fabrication. According to another embodiment, the integrated circuit has also undergone a back end of line (BEOL) stage of IC fabrication. According to yet another embodiment, the ESD system may include a plurality of air gap metal tip structures, as shown in FIG. 5. The plurality of air gap metal tip structures, according to one or more embodiments, can be either evenly spaced all over the ESD system or can be spaced based on ESD system needs.

Figure 4:
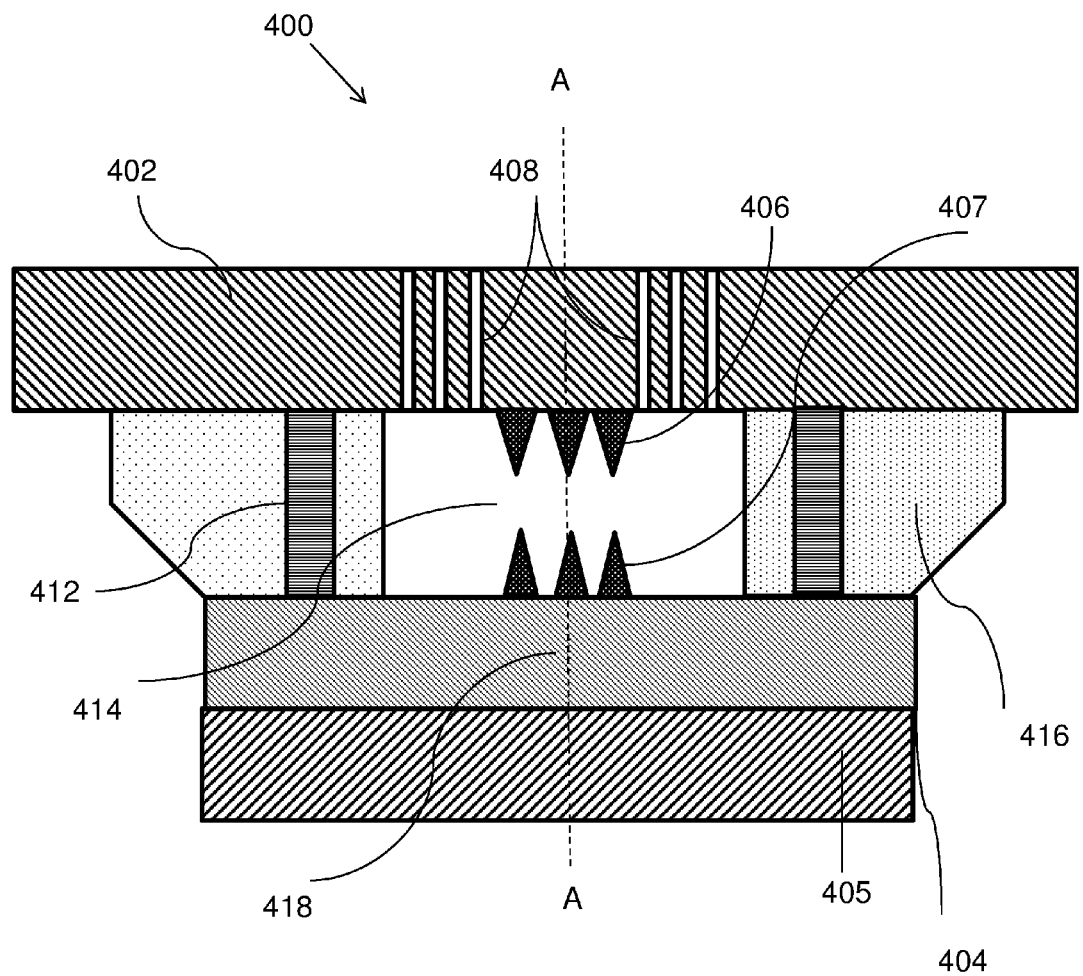
FIG. 4 depicts a side cross-sectional view of an ESD system that includes an air gap metal tip structure in accordance with some embodiments of this disclosure.

FIG. 4 depicts a side cross-sectional view of an ESD system that includes an air gap metal tip structure in accordance with some embodiments of this disclosure.

The ESD system 400 includes a lower substrate 404, an upper substrate 402, and an underfill layer 416. The lower substrate 404 includes one or more layers of logic circuitry. Particularly, the lower substrate 404 includes a silicon substrate 405 and an integrated circuit 418 disposed on the silicon substrate 405, wherein the integrated circuit 418 has undergone a front end of line (FEOL) stage of IC fabrication. According to another embodiment, the integrated circuit 418 has also undergone a back end of line (BEOL) stage of IC fabrication. The underfill layer 416 is located on the integrated circuit 418 and includes at least one cavity that is configured to only contain air. This cavity can be called an air chamber 414. The upper substrate 402 is located on top of the underfill layer 416 and includes a plurality of air ventilation shafts 408. The plurality of air ventilation shafts 408 extend from the air chamber 414 through the upper substrate 402 to an upper surface of the upper substrate 402. Further, as shown in FIG. 4, the ventilation shafts 408 are placed in clusters of, for example, three on either side of the plurality of upper metal tips 406. The ESD system 400 also includes an air gap metal tip structure that includes the cavity, or also called the air chamber 414, that is connected to the plurality of ventilation shafts 408.

The air gap metal tip structure also includes a plurality of upper metallic tips 406 and a plurality of lower metallic tips 407. Specifically, as show the air gap metal tip structure has three upper metallic tips and three lower metallic tips. Each of the plurality of upper metallic tips 406 include a first contact surface that is attached to an inner ceiling surface of the upper substrate 402. Each of the plurality of upper metallic tips 406 also includes a first body that extends downward from the inner ceiling surface and a first point. The first body is tapered to form the first point opposite the first contact surface away from the inner ceiling surface. The air gap tip structure also includes a plurality of lower metallic tips 407. Each of the plurality of lower metallic tips 407 includes a second contact surface that is attached to an inner floor surface of the lower substrate 404. The plurality of lower metallic tips 407 also includes a second body that extends upward from the inner floor surface and a second point. The second body is tapered to form the second point opposite the second contact surface away from the inner floor surface.

Further, the first point of each of the plurality of the upper metallic tips 406 and the second point of each of the plurality of lower metallic tips 407 are disposed in-line with a vertical axis A-A which is perpendicular to the upper substrate 402 and the lower substrate 404. An air cavity is provided between the first point and the second point by the air chamber 414 formed between the upper substrate 402 and the lower substrate 404 within which the plurality of upper metallic tips 406 and the plurality of lower metallic tips 407 are disposed.

The air gap metallic tip structure also includes a conductive connection that extends around the air chamber 414 and connects one or more of the plurality of upper metallic tips 406 and one or more of the plurality of lower metallic tips 407 by connecting the first contact surface to the second contact surface. The conductive connection extends from the first contact surface, through the upper substrate 402, down through the underfill layer 416 and through the lower substrate 404 to the second contact surface. According to an embodiment, the conductive connection can be a redistribution layer (RDL). The conductive connection can also include a metallic pillar 412 that extends through the underfill layer 416 providing a conductive path between the upper substrate 402 and the lower substrate 404. A similar conductive connection and metallic pillar 412 connection arrangement can be provided for each of the plurality of upper and lower metallic tips 406, 407.

According to one or more embodiments, the plurality of upper metallic tips 406 and the plurality of lower metallic tips 407 are atomic-level sharp protrusions. According to another embodiment, the upper substrate 402 is an organic substrate. According to yet another embodiment, the ESD system may include a plurality of air gap metal tip structures, as shown in FIG. 5. The plurality of air gap metal tip structures, according to one or more embodiments, can be either evenly spaced all over the ESD system or can be spaced based on ESD system needs.

FIG. 5 depicts a side cross-sectional view of an ESD system 500 that includes a plurality of air gap metal tip structures in accordance with some embodiments of this disclosure.

The ESD system 500 includes a lower substrate 504, an upper substrate 502, and an underfill layer 516. The lower substrate 504 can include one or more layers of logic circuitry. The underfill layer 516 is located on the lower substrate 504 and includes at least two cavities that are configured to only contain air. These cavities can be called air chambers 514A, 514B. The upper substrate 502 is located on top of the underfill layer 516 and includes a plurality of air ventilation shafts 508A, 508B. The plurality of air ventilation shafts 508A, 508B extend from the air chambers 514A, 514B through the upper substrate 502 to an upper surface of the upper substrate 502. Further, as shown in FIG. 5, the ventilation shafts 508A, 508B are placed in an alternating pattern between each of the plurality of upper metal tips 506A, 506B. The cavities, or also called the air chambers 514A, 514B, are connected to the plurality of ventilation shafts 508A, 508B, respectively.

The air gap metal tip structures also include a plurality of upper metallic tips 506A, 506B and a plurality of lower metallic tips 507A, 507B. Specifically, as show the air gap metal tip structures have two upper metallic tips 506A, 506B and two lower metallic tips 507A, 507B. Each of the plurality of upper metallic tips 506A, 506B includes a first contact surface that is attached to an inner ceiling surface of the upper substrate 502. Each of the plurality of upper metallic tips 506A, 506B also includes a first body that extends downward from the inner ceiling surface and a first point. The first body is tapered to form the first point opposite the first contact surface away from the inner ceiling surface. The air gap tip structures also include a plurality of lower metallic tips 507A, 507B. Each of the plurality of lower metallic tips 507A, 507B includes a second contact surface that is attached to an inner floor surface of the lower substrate 504. The plurality of lower metallic tips 507A, 507B also include a second body that extends upward from the inner floor surface and a second point. The second body is tapered to form the second point opposite the second contact surface away from the inner floor surface.

Further, the first point of each of the plurality of the upper metallic tips 506A,506B and the second point of each of the plurality of lower metallic tips 507A,507B are disposed in-line with a vertical axis A-A which is perpendicular to the upper substrate 502 and the lower substrate 504. An air cavity is provided between the first point and the second point by the air chambers 514A,514B formed between the upper substrate 502 and the lower substrate 504 within which the plurality of upper metallic tips 506A,506B and the plurality of lower metallic tips 507A,507B are disposed.

The air gap metallic tip structures also include a conductive connection that extends around the air chamber 514A,514B and connects one of the plurality of upper metallic tips 506A, 506B and one of the plurality of lower metallic tips 507A, 507B by connecting the first contact surface to the second contact surface. The conductive connection extends from the first contact surface, through the upper substrate 502, down through the underfill layer 516 and through the lower substrate 504 to the second contact surface. According to an embodiment, the conductive connection can be a redistribution layer (RDL). The conductive connection can also include a metallic pillar 512A that extends through the underfill layer 516 providing a conductive path between the upper substrate 502 and the lower substrate 504. A similar conductive connection and metallic pillar 512A connection arrangement can be provided for each of the plurality of upper and lower metallic tips 506A, 506B, 507A, 507B.

According to one or more embodiments, the plurality of upper metallic tips 506A, 506B and the plurality of lower metallic tips 507A, 507B are atomic-level sharp protrusions. According to another embodiment, the upper substrate 502 is an organic substrate and the lower substrate 504 is a silicon substrate. According to another embodiment, the lower substrate 504 includes a silicon substrate and an integrated circuit disposed on the silicon substrate, wherein the integrated circuit has undergone a front end of line (FEOL) stage of IC fabrication. According to another embodiment, the integrated circuit has also undergone a back end of line (BEOL) stage of IC fabrication. The plurality of air gap metal tip structures, according to one or more embodiments, can be either evenly spaced all over the ESD system or can be spaced based on ESD system needs.

Figure 6A:
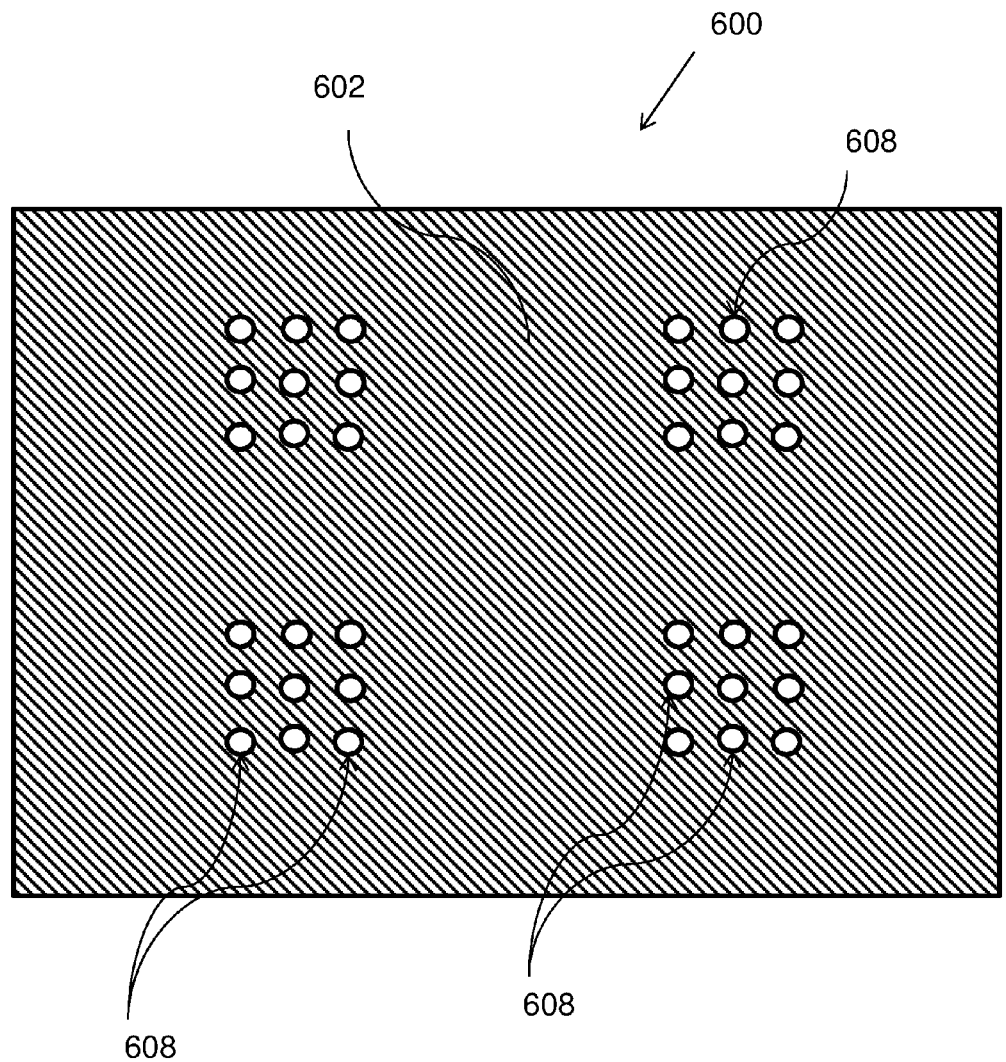
FIG. 6A depicts a top view of an ESD system, similar to the ESD system of FIG. 5, that includes a plurality of air gap metal tip structures in accordance with some embodiments of this disclosure.

FIG. 6A depicts a top view of an ESD system 600, similar to the ESD system 500 of FIG. 5, that includes a plurality of air gap metal tip structures in accordance with some embodiments of this disclosure. As shown, the ESD system 600 had a plurality of ventilation shafts 608 that are grouped into clusters of ventilation shafts. These clusters are each part of their own air gap metallic tip structure as shown in FIG. 6B.

Figure 6B:
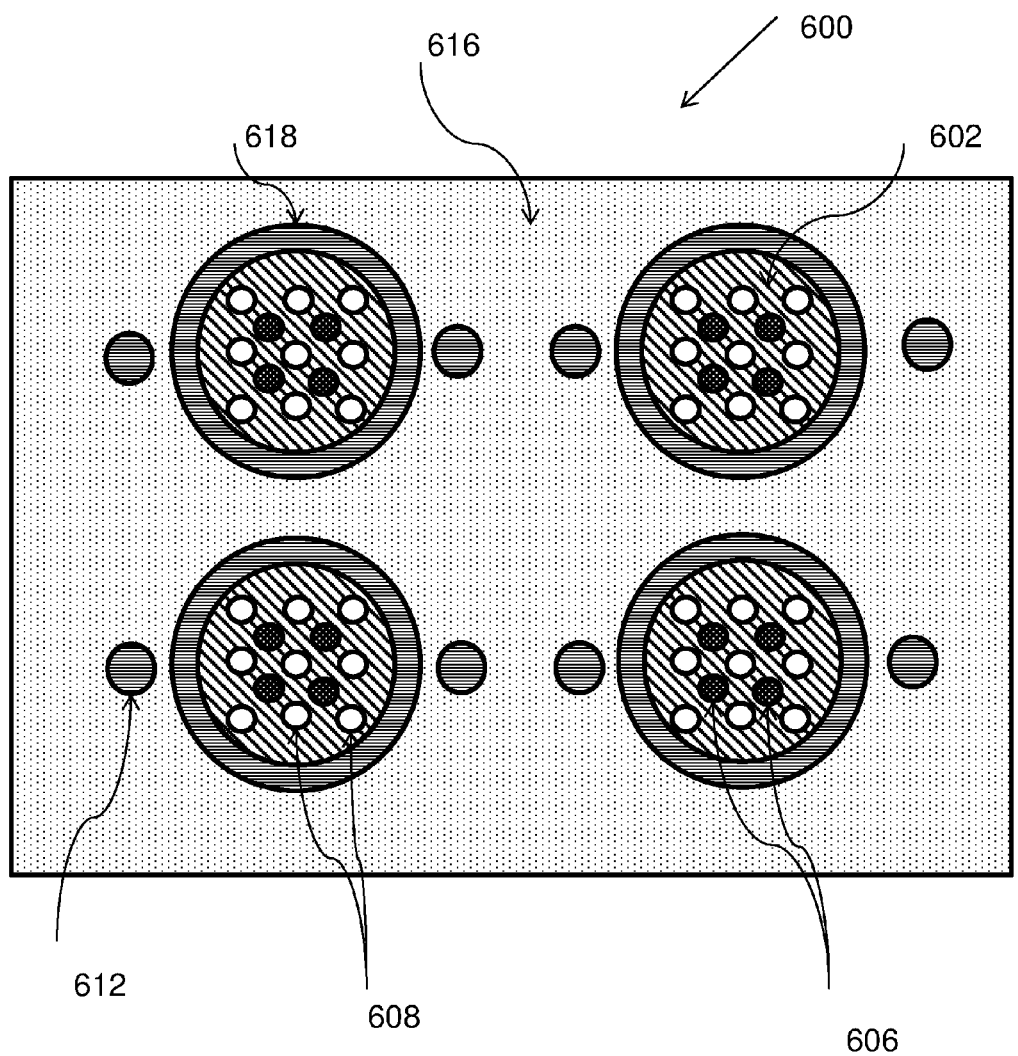
FIG. 6B depicts a top cross-sectional view of an ESD system along axis B-B as shown in FIG. 5, that includes a plurality of air gap metal tip structures in accordance with some embodiments of this disclosure.

FIG. 6B depicts a top cross-sectional view of an ESD system 600 along axis B-B as shown in FIG. 5, that includes a plurality of air gap metal tip structures embedded within an underfill layer 616 in accordance with some embodiments of this disclosure. As shown, the ESD system 600 includes a plurality of hollow cylindrical metallic pillars 618. The ESD system 600 also includes a plurality of solid cylindrical metallic pillars 612 that can serve to help provide a connection path. The ESD system 600 also includes a plurality of metallic tip clusters 606 that are attached to an upper substrate 602 as shown. A plurality of ventilation shaft clusters 608 as also provided that extend through the upper substrate 602 and are positioned such that they alternate in position forming a grid with the plurality of metallic tip clusters 606. According to other embodiments each of the air gap metal tip structures can be reduced dramatically in size in proportion to the overall size of the ESD system 600.

Figure 7A:
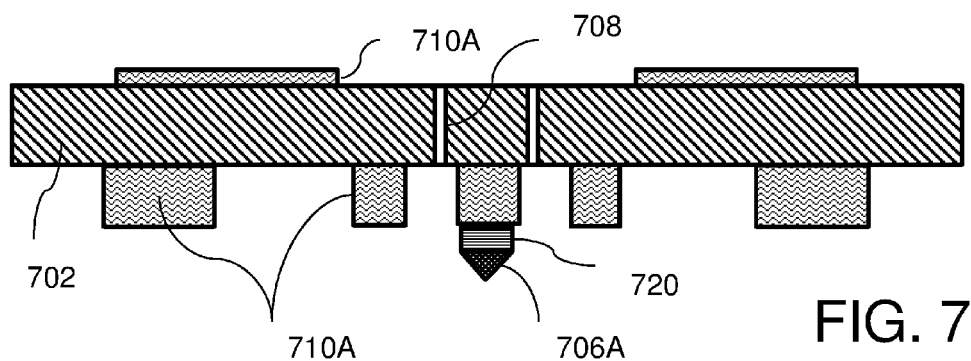
FIG. 7A depicts a side cross-sectional view of a top portion of an ESD system during a manufacturing process in accordance with some embodiments of this disclosure.

FIG. 7A depicts a side cross-sectional view of a top portion of an ESD system during a manufacturing process in accordance with some embodiments of this disclosure. As shown, initially an upper substrate 702 is provided. The upper substrate 702 is etched and patterned to have ventilation shafts 708. Further, metallic material elements 710A are transferred on the upper substrate 702. One of the metallic material elements 710A is then selected upon which an upper metallic tip base 720 and an upper metallic tip 706A are transferred.

Figure 7B:
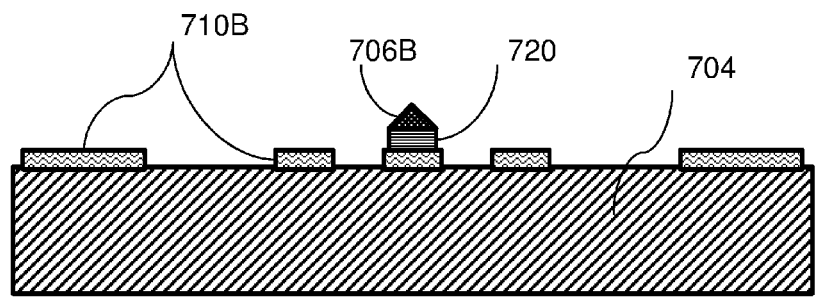
FIG. 7B depicts a side cross-sectional view of a bottom portion of an ESD system during a manufacturing process in accordance with some embodiments of this disclosure.

FIG. 7B depicts a side cross-sectional view of a bottom portion of an ESD system during a manufacturing process in accordance with some embodiments of this disclosure. During a similar point in the manufacturing process that is shown in FIG. 7A, the structure shown in FIG. 7B can be prepared. As shown, initially a lower substrate 704 is provided. Metallic material elements 710B are transferred on the lower substrate 704. One of the metallic material elements 710B is then selected upon which a lower metallic tip base 720 and a lower metallic tip 706B are transferred.

Figure 7C:
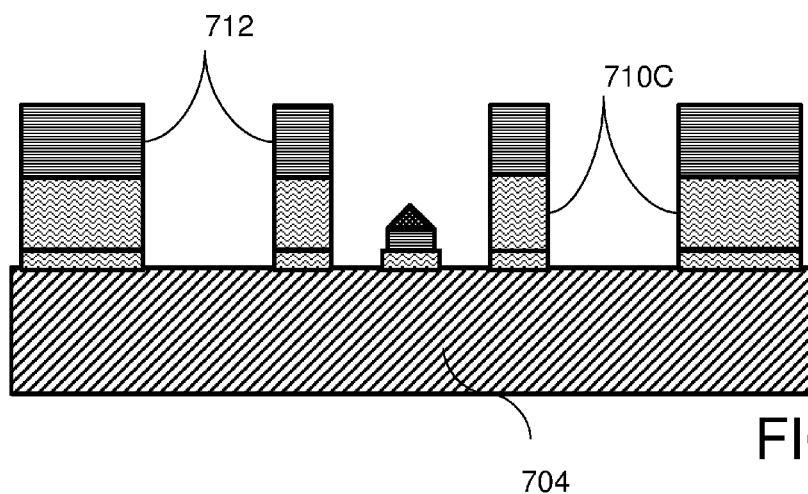
FIG. 7C depicts a side cross-sectional view of a bottom portion of an ESD system during a manufacturing process in accordance with some embodiments of this disclosure.

FIG. 7C depicts a side cross-sectional view of a bottom portion of an ESD system, which is substantially similar to the structure shown in FIG. 7C with some additional elements added on, during a manufacturing process in accordance with some embodiments of this disclosure. Particularly, as shown, additional metallic material elements 712 are attached on top of the metallic material elements 710C which are provided on top of metallic material elements 710B. The metallic material elements 710A,710B,710C,712 are provided such that together they provide a height that is greater than the sum total height of both metallic tip bases 720 and upper and lower metal tips 706A,706B.

Figure 8A:
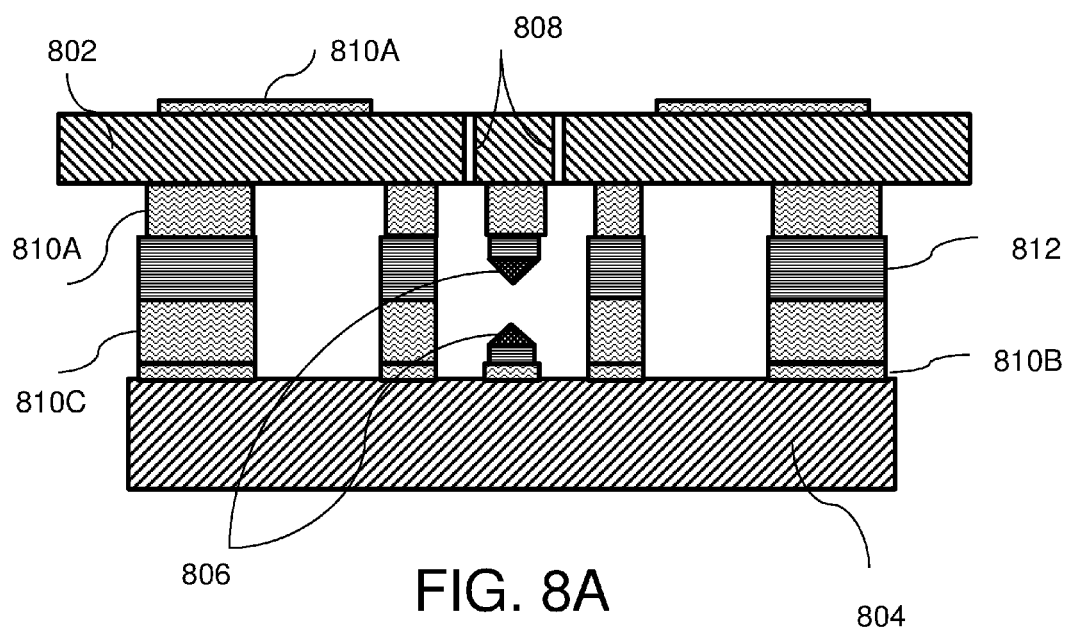
FIG. 8A depicts a side cross-sectional view of a partially completed ESD system during a manufacturing process in accordance with some embodiments of this disclosure.

FIG. 8A depicts a side cross-sectional view of a partially completed ESD system during a manufacturing process in accordance with some embodiments of this disclosure. As shown, in this figure the top portion of the ESD system as shown in FIG. 7A and the bottom portion of the ESD system as shown in FIG. 7C are bonded together to form a partially completed ESD system. This partial ESD system includes an upper substrate 802 and a lower substrate 804. The upper substrate includes ventilation shafts 808 as well as a plurality of metallic material elements 810A. The lower substrate 804 also includes a plurality of metallic material elements 810B, 810C, and 812 that are bonded together with the metallic material elements 810A of the upper substrate 802. The partially completed ESD system also includes upper and lower metallic tips 806 that are now provided within an air chamber and are positioned above one another.

Figure 8B:
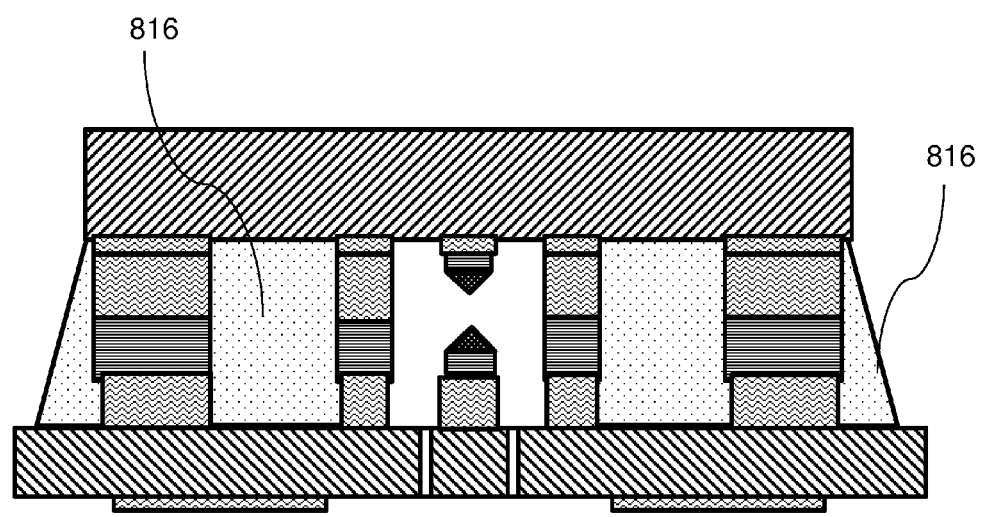
FIG. 8B depicts a side cross-sectional view of a completed ESD system during a manufacturing process in accordance with some embodiments of this disclosure.

FIG. 8B depicts a side cross-sectional view of a completed ESD system during a manufacturing process in accordance with some embodiments of this disclosure. As shown, the completed ESD system includes all the same elements as shown in FIG. 8A. In addition to all those elements, the completed ESD system also includes an underfill layer 816 that is injected between the upper substrate and the lower substrate. Further, as shown, the underfill layer 816 is provided with at least one air chamber that is provided around the upper and lower metallic tips 806, and which is connected to the ventilation shafts.

Figure 9:
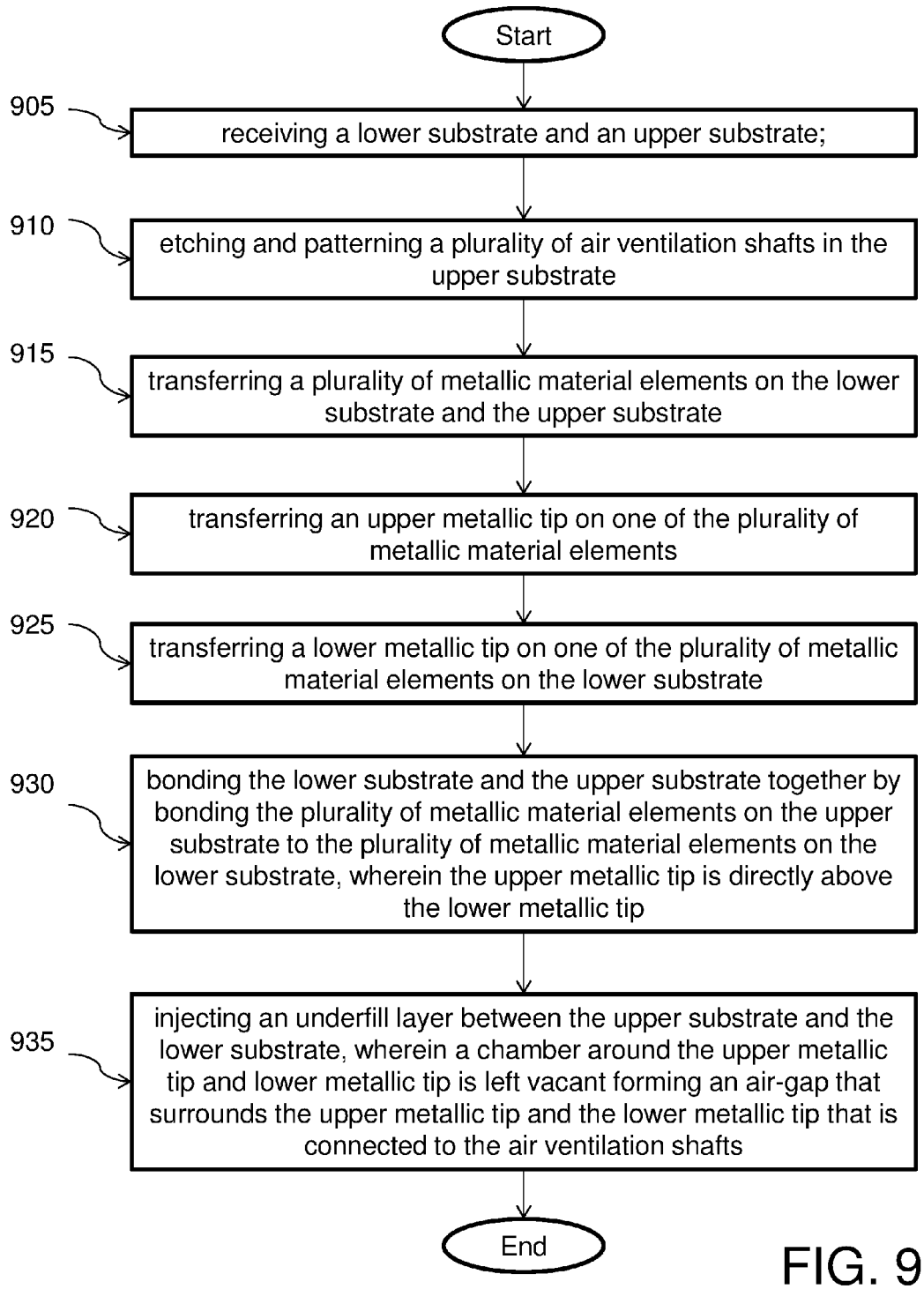
FIG. 9 depicts a process flow of a method of manufacturing an ESD system that includes at least one air gap metal tip structure in accordance with some embodiments of this disclosure.

FIG. 9 depicts a process flow of a method of manufacturing an ESD system that includes at least one air gap metal tip structure in accordance with some embodiments of this disclosure. The method includes receiving a lower substrate and an upper substrate (operation 905). The method also includes etching and patterning a plurality of air ventilation shafts in the upper substrate (operation 910). The method goes on to also include transferring a plurality of metallic material elements on the lower substrate and the upper substrate (operation 915), along with an upper metallic tip on one of the plurality of metallic material elements on the upper substrate (operation 920), wherein the upper metallic tip is adjacent to the air ventilation shafts, and transferring a lower metallic tip on one of the plurality of metallic material elements on the lower substrate (operation 925). Further, the method also includes bonding the lower substrate and the upper substrate together by bonding the plurality of metallic material elements on the upper substrate to the plurality of metallic material elements on the lower substrate, wherein the upper metallic tip is directly above the lower metallic tip (operation 930).

The method also includes injecting an underfill layer between the upper substrate and the lower substrate, wherein a chamber around the upper metallic tip and lower metallic tip is left vacant forming an air gap that surrounds the upper metallic tip and the lower metallic tip that is connected to the air ventilation shafts (operation 935).

According to one or more embodiments, one or more of the disclosed metallic pillars can be made from, for example, controlled collapse chip connection (C4) and/or copper (Cu) functioned as a conductive wire between the substrates to connect the metallic tips. According to other embodiments, the metallic tips can be made from or coated with gold (Au). According to one or more embodiments, the lower substrate can be made from silicon germanium. According to one or more embodiments, the metallic material elements as shown in FIGS. 7A through 8B can be made from tin, gold, silver, copper, or any combination thereof. Further, the manufacturing process shown in FIGS. 7A through 8B can be implemented using process temperatures of, for example, 300-400 Celsius. Once constructed, the air gap metallic tip structure can withstand, for example, an air chamber discharge $E_{BD}$ that is equal to 30 KV/cm during which time the oxygen in the air chamber is temporarily changed from oxygen to ozone and then back again. The ESD system as disclosed can be used for ESD protection of a circuit operation at high frequencies, for example, 13 gigahertz up to 16 gigahertz or higher. Further, according to another embodiment, a computer chip may be provided with six to eight of the air gap metallic tip structures for providing ESD protection capabilities. According to another embodiment, the metallic tips that are being used in one or more embodiments can be scalable to a pitch of a few microns, provide fast and low force release, provide submicron tip sharpness, and can be low cost to produce with a high yield in fabrication.

Technical effects and benefits of some embodiments include not only serving for testing purpose, but also can relieve multiple-times external "hot unplug/plug" issues and internal material/device damages by electro-static discharge. Another example is provided such that at high speed operations, this design structure has: no big intrinsic parasitic capacitance from traditional diode devices; improved transistor performance without high frequency noises from Vdd or Gnd; no internal device/dielectric damages from multiple discharges; much better reliability and endurance; premier re-usability and cycling performance; and advanced process compatibility. Demanding high-speed applications like 4G/5G telecommunications require high-performance ESD devices which are covered by one or more of the above discussed embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Java, Smalltalk, C++, or the like, and conventional procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function (s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An air gap metal tip structure for electrostatic discharge (ESD) protection comprising:
    an upper metallic tip comprising:
        a first contact surface that is attached to an inner ceiling surface of an upper substrate;
        a first body that extends downward from the inner ceiling surface; and
        a first point, wherein the first body is tapered to form the first point opposite the first contact surface away from the inner ceiling surface;
    a lower metallic tip comprising:
        a second contact surface that is attached to an inner floor surface of a lower substrate;
        a second body that extends upward from the inner floor surface; and
        a second point, wherein the second body is tapered to form the second point opposite the second contact surface away from the inner floor surface,
    wherein the first point of the upper metallic tip and the second point of the lower metallic tip are disposed along a vertical axis that is perpendicular to the upper substrate and the lower substrate, and wherein an air cavity is provided between the first point and the second point; and
    an air chamber formed between the upper substrate and the lower substrate within which the upper metallic tip and the lower metallic tip are disposed.

2. The air gap metal tip structure of claim 1, wherein the upper substrate comprises:
    a plurality of air ventilation shafts that extend from the air chamber through the upper substrate to an upper surface of the upper substrate.

3. The air gap metal tip structure of claim 1, further comprising:
    a conductive connection that extends around the air chamber and connects the upper metallic tip and the lower metallic tip by connecting the first contact surface to the second contact surface; and
    an underfill layer that is disposed between the upper substrate and the lower substrate,
    wherein the conductive connection extends from the first contact surface, through the upper substrate, down through the underfill layer, and through the lower substrate to the second contact surface.

4. The air gap metal tip structure of claim 3,
    wherein the conductive connection is a redistribution layer (RDL), and
    wherein the conductive connections comprises a metallic pillar that extends through the underfill layer providing a conductive path between the upper substrate and the lower substrate.

5. The air gap metal tip structure of claim 1, wherein the upper metallic tip and the lower metallic tip are atomic-level sharp protrusions.

6. The air gap metal tip structure of claim 1, wherein the upper substrate is an organic substrate.

7. The air gap metal tip structure of claim 1, wherein the lower substrate is a silicon substrate.

8. The air gap metal tip structure of claim 1, wherein the lower substrate comprises:
   a silicon substrate; and
   an integrated circuit disposed on the silicon substrate, wherein the integrated circuit has undergone a front end of line (FEOL) stage of IC fabrication.

9. The air gap metal tip structure of claim 8, wherein the integrated circuit has also undergone a back end of line (BEOL) stage of IC fabrication.

10. The air gap metal tip structure of claim 1, further comprising:
   a plurality of upper metallic tips comprising:
      a first plurality of contact surfaces that are attached to the inner ceiling surface of the upper substrate;
      a first plurality of bodies that extend downward from the inner ceiling surface; and
      a first plurality of points, wherein the first plurality of bodies are tapered to form the first plurality of points opposite the first plurality of contact surfaces away from the inner ceiling surface; and
   a plurality of lower metallic tips comprising:
      a second plurality of contact surfaces that are attached to the inner floor surface of the lower substrate;
      a second plurality of bodies that extend upward from the inner floor surface; and
      a second plurality of points, wherein the second plurality of bodies are tapered to form the second plurality of points opposite the second contact surface away from the inner floor surface,
   wherein the first plurality of points of the plurality of upper metallic tips and the second plurality of points of the plurality of lower metallic tips are disposed along a plurality of vertical axis that are each perpendicular to the upper substrate and the lower substrate, and wherein the air cavity is provided between the first plurality of points and the second plurality of points, and
   wherein the air chamber is formed between the upper substrate and the lower substrate within which the plurality of upper metallic tips and the plurality of lower metallic tips are disposed.

11. An electrostatic discharge (ESD) system for ESD protection, the ESD system comprising:
   a lower substrate that comprises one or more layers of logic circuitry;
   an underfill layer that is disposed on the lower substrate, wherein the underfill layer includes a plurality of cavities;
   an upper substrate disposed on the underfill layer, wherein the upper substrate comprises a plurality of air ventilation shafts; and
   a plurality of air gap metal tip structures disposed within one or more of the plurality of cavities in the underfill layer, wherein the plurality of ventilation shafts line up with the plurality of air gap metal tip structures, and wherein at least one air gap tip structure comprises:
      an upper metallic tip comprising:
         a first contact surface that is attached to an inner ceiling surface of the upper substrate;
         a first body that extends downward from the inner ceiling surface; and
         a first point, wherein the first body is tapered to form the first point opposite the first contact surface away from the inner ceiling surface;
      a lower metallic tip comprising:
         a second contact surface that is attached to an inner floor surface of the lower substrate;
         a second body that extends upward from the inner floor surface; and
         a second point, wherein the second body is tapered to form the second point opposite the second contact surface away from the inner floor surface,
      wherein the first point of the upper metallic tip and the second point of the lower metallic tip are disposed along a vertical axis that is perpendicular to the upper substrate and the lower substrate, and wherein an air cavity is provided between the first point and the second point; and
      an air chamber formed between the upper substrate and the lower substrate within which the upper metallic tip and the lower metallic tip are disposed.

12. The ESD system of claim 11, wherein the plurality of air gap metal tip structures are evenly spaced all over the ESD system.

13. The ESD system of claim 11, wherein the plurality of air gap metal tip structures are spaced based on ESD system needs.

14. The ESD system of claim 11, further comprising:
   a conductive connection that extends around the air chamber and connects the upper metallic tip and the lower metallic tip by connecting the first contact surface to the second contact surface,
   wherein the conductive connection extends from the first contact surface, through the upper substrate, down through the underfill layer, and through the lower substrate to the second contact surface.

15. The ESD system of claim 14,
   wherein the conductive connection is a redistribution layer (RDL), and
   wherein the conductive connection comprises a metallic pillar that extends through the underfill layer providing a conductive path between the upper substrate and the lower substrate.

16. The ESD system of claim 11,
   wherein the upper metallic tip and the lower metallic tip are atomic-level sharp protrusions,
   wherein the upper substrate is an organic substrate, and
   wherein the lower substrate is a silicon substrate.

17. The ESD system of claim 11, wherein the lower substrate comprises:
   a silicon substrate; and
   an integrated circuit disposed on the silicon substrate, wherein the integrated circuit has undergone a front end of line (FEOL) stage of IC fabrication.

18. The ESD system of claim 17, wherein the integrated circuit has also undergone a back end of line (BEOL) stage of IC fabrication.

19. The ESD system of claim 11, further comprising:
   a plurality of upper metallic tips comprising:
      a first plurality of contact surfaces that are attached to the inner ceiling surface of the upper substrate;
      a first plurality of bodies that extend downward from the inner ceiling surface; and
      a first plurality of points, wherein the first plurality of bodies are tapered to form the first plurality of points opposite the first plurality of contact surfaces away from the inner ceiling surface; and
   a plurality of lower metallic tips comprising:
      a second plurality of contact surfaces that are attached to the inner floor surface of the lower substrate;

a second plurality of bodies that extend upward from the inner floor surface; and a second plurality of points, wherein the second plurality of bodies are tapered to form the second plurality of points opposite the second contact surface away from the inner floor surface, wherein the first plurality of points of the plurality of upper metallic tips and the second plurality of points of the plurality of lower metallic tips are disposed along a plurality of vertical axis that are each perpendicular to the upper substrate and the lower substrate, and wherein the air cavity is provided between the first plurality of points and the second plurality of points, and wherein the air chamber is formed between the upper substrate and the lower substrate within which the plurality of upper metallic tips and the plurality of lower metallic tips are disposed.

20. A method of manufacturing an electrostatic discharge (ESD) system for ESD protection, the method comprising:

receiving a lower substrate and an upper substrate;

etching and patterning a plurality of air ventilation shafts in the upper substrate;

transferring a plurality of metallic material elements on the lower substrate and the upper substrate;

transferring an upper metallic tip on one of the plurality of metallic material elements on the upper substrate, wherein the upper metallic tip is adjacent to the air ventilation shafts;

transferring a lower metallic tip on one of the plurality of metallic material elements on the lower substrate;

bonding the lower substrate and the upper substrate together by bonding the plurality of metallic material elements on the upper substrate to the plurality of metallic material elements on the lower substrate, wherein the upper metallic tip is directly above the lower metallic tip; and injecting an underfill layer between the upper substrate and the lower substrate, wherein a chamber around the upper metallic tip and lower metallic tip is left vacant forming an air gap that surrounds the upper metallic tip and the lower metallic tip that is connected to the air ventilation shafts.

* * * * *